(12) United States Patent
Bykanov et al.

(10) Patent No.: US 8,519,366 B2
(45) Date of Patent: Aug. 27, 2013

(54) DEBRIS PROTECTION SYSTEM HAVING A MAGNETIC FIELD FOR AN EUV LIGHT SOURCE

(75) Inventors: Alexander N. Bykanov, San Diego, CA (US); Alexander I. Ershov, Escondido, CA (US)

(73) Assignee: Cymer, Inc., San Diego, CA (US)

( * ) Notice: Subject to any disclaimer, the term of this patent is extended or adjusted under 35 U.S.C. 154(b) by 502 days.

(21) Appl. No.: 12/221,822

(22) Filed: Aug. 6, 2008

(65) Prior Publication Data

US 2010/0032590 A1 Feb. 11, 2010

(51) Int. Cl.
 *H05G 2/00* (2006.01)
(52) U.S. Cl.
 USPC ............... 250/504 R; 250/493.1; 250/396 R; 250/396 ML
(58) Field of Classification Search
 USPC ............... 250/493.1, 504 R, 396 R, 396 ML
 See application file for complete search history.

(56) References Cited

U.S. PATENT DOCUMENTS

| | | | |
|---|---|---|---|
| 4,223,279 A | 9/1980 | Bradford, Jr. et al. | 331/94.5 |
| 4,247,829 A | 1/1981 | Yagi et al. | 331/94 |
| 4,251,781 A | 2/1981 | Sutter, Jr. | 331/94 |
| 4,414,488 A | 11/1983 | Hoffmann et al. | 315/39 |
| 4,455,658 A | 6/1984 | Sutter, Jr. | 372/38 |
| 4,546,482 A | 10/1985 | Bagaglia et al. | 372/86 |
| 4,686,682 A | 8/1987 | Haruta et al. | 372/87 |
| 4,703,490 A | 10/1987 | Brumme et al. | 372/86 |
| 4,742,527 A | 5/1988 | Wiedemann et al. | 372/87 |
| 4,774,714 A | 9/1988 | Javan | 372/109 |
| 4,860,300 A | 8/1989 | Baumler et al. | 372/57 |
| 4,866,682 A | 9/1989 | Uchihashi et al. | 372/87 |
| 4,876,693 A | 10/1989 | Lucero et al. | 372/82 |
| 4,953,174 A | 8/1990 | Eldridge et al. | 372/87 |
| 4,959,840 A | 9/1990 | Akins et al. | 372/57 |
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,048,041 A | 9/1991 | Akins et al. | 372/57 |
| 5,070,513 A | 12/1991 | Letardi | 372/83 |
| 5,187,716 A | 2/1993 | Haruta et al. | 372/57 |
| 5,189,678 A | 2/1993 | Ball et al. | 372/28 |
| 5,247,534 A | 9/1993 | Muller-Horsche | 372/58 |

(Continued)

FOREIGN PATENT DOCUMENTS

| | | |
|---|---|---|
| EP | 1422570 A2 | 5/2004 |
| EP | 1434095 A1 | 6/2004 |

(Continued)

OTHER PUBLICATIONS

Harilal, et al ("Ion debris mitigation from tin plasma using ambient gas, magnetic field and combined effects," Appl. Phys. B 00, 1-7 (2006).*

(Continued)

*Primary Examiner* — Michael Maskell
(74) *Attorney, Agent, or Firm* — Arent Fox LLP (57) ABSTRACT

Devices are disclosed herein which may comprise a vessel; a material disposed in the vessel for creating an EUV light emitting plasma at a plasma site, the plasma generating debris; a near normal incidence EUV reflective optic disposed in the vessel; and a source of a magnetic field for deflecting debris in the vessel to protect the optic, the source positioned to interpose the optic between the source and the plasma site.

23 Claims, 8 Drawing Sheets

(56) References Cited

U.S. PATENT DOCUMENTS

| | | | |
|---|---|---|---|
| 5,313,481 A | 5/1994 | Cook et al. | 372/37 |
| 5,315,611 A | 5/1994 | Ball et al. | 372/56 |
| 5,359,620 A | 10/1994 | Akins | 372/58 |
| 5,448,580 A | 9/1995 | Birx et al. | 372/38 |
| 5,471,965 A | 12/1995 | Kapich | 123/565 |
| 5,535,233 A | 7/1996 | Mizoguchi et al. | 372/87 |
| 5,557,629 A | 9/1996 | Mizoguchi et al. | 372/87 |
| 5,646,954 A | 7/1997 | Das et al. | 372/25 |
| 5,729,565 A | 3/1998 | Meller et al. | 372/87 |
| 5,763,930 A | 6/1998 | Partlo | 250/504 R |
| 5,771,258 A | 6/1998 | Morton et al. | 372/57 |
| 5,852,621 A | 12/1998 | Sandstrom | 372/25 |
| 5,863,017 A | 1/1999 | Larson et al. | 248/176.1 |
| 5,875,207 A | 2/1999 | Osmanow | 372/86 |
| 5,940,421 A | 8/1999 | Partlo et al. | 372/38 |
| 5,953,360 A | 9/1999 | Vitruk et al. | 372/87 |
| 6,005,879 A | 12/1999 | Sandstrom et al. | 372/25 |
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,034,978 A | 3/2000 | Ujazdowski et al. | 372/34 |
| 6,051,841 A | 4/2000 | Partlo | 250/504 R |
| 6,064,072 A | 5/2000 | Partlo et al. | 250/504 R |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,109,574 A | 8/2000 | Pan et al. | 248/176.1 |
| 6,128,323 A | 10/2000 | Myers et al. | 372/38 |
| 6,151,349 A | 11/2000 | Gong et al. | 372/58 |
| 6,164,116 A | 12/2000 | Rice et al. | 73/1.72 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,212,211 B1 | 4/2001 | Azzola et al. | 372/23 |
| 6,219,368 B1 | 4/2001 | Govorkov | 372/59 |
| 6,240,117 B1 | 5/2001 | Gong et al. | 372/58 |
| 6,317,447 B1 | 11/2001 | Partlo et al. | 372/57 |
| 6,365,894 B2* | 4/2002 | Tadokoro et al. | 250/298 |
| 6,414,979 B2 | 7/2002 | Ujazdowski et al. | 372/87 |
| 6,452,199 B1 | 9/2002 | Partlo et al. | 250/504 R |
| 6,466,602 B1 | 10/2002 | Fleurov et al. | 372/87 |
| 6,477,193 B2 | 11/2002 | Oliver et al. | 372/58 |
| 6,493,374 B1 | 12/2002 | Fomenkov et al. | 372/102 |
| 6,541,786 B1 | 4/2003 | Partlo et al. | 250/504 R |
| 6,549,551 B2 | 4/2003 | Ness et al. | 372/38.07 |
| 6,556,612 B2 | 4/2003 | Ershov et al. | 372/103 |
| 6,567,450 B2 | 5/2003 | Myers et al. | 372/55 |
| 6,576,912 B2 | 6/2003 | Visser et al. | 250/492.2 |
| 6,618,421 B2 | 9/2003 | Das et al. | 372/55 |
| 6,625,191 B2 | 9/2003 | Knowles et al. | 372/55 |
| 6,635,844 B2 | 10/2003 | Yu | 219/121.68 |
| 6,693,939 B2 | 2/2004 | Klene et al. | 372/58 |
| 6,782,031 B1 | 8/2004 | Hofmann et al. | 372/90 |
| 6,928,093 B2 | 8/2005 | Webb et al. | 372/25 |
| 6,972,421 B2 | 12/2005 | Melnychuk et al. | 250/504 R |
| 7,002,168 B2 | 2/2006 | Jacob et al. | 250/504 R |
| 7,068,697 B1 | 6/2006 | Amada et al. | 372/58 |
| 7,087,914 B2 | 8/2006 | Akins et al. | 250/504 R |
| 7,135,693 B2 | 11/2006 | Roux | 250/492.2 |
| 7,164,144 B2 | 1/2007 | Partlo et al. | 250/504 R |
| 7,196,342 B2 | 3/2007 | Ershov et al. | 250/504 R |
| 7,217,940 B2* | 5/2007 | Partlo et al. | 250/504 R |
| 7,217,941 B2* | 5/2007 | Rettig et al. | 250/504 R |
| 7,230,258 B2 | 6/2007 | Ruzic et al. | 250/504 R |
| 7,251,012 B2* | 7/2007 | Banine et al. | 355/30 |
| 7,271,401 B2* | 9/2007 | Imai et al. | 250/504 R |
| 7,315,346 B2 | 1/2008 | Van Beek et al. | 355/30 |
| 7,323,703 B2* | 1/2008 | Oliver et al. | 250/504 R |
| 7,361,918 B2 | 4/2008 | Akins et al. | 250/504 R |
| 7,365,349 B2 | 4/2008 | Partlo et al. | 250/504 R |
| 7,368,741 B2 | 5/2008 | Melnychuk et al. | 250/504 R |
| 7,372,056 B2 | 5/2008 | Bykanov et al. | 250/504 R |
| 7,378,673 B2 | 5/2008 | Bykanov et al. | 250/503.1 |
| 7,394,083 B2 | 7/2008 | Bowering et al. | 250/504 R |
| 7,405,416 B2 | 7/2008 | Algots et al. | 250/493.1 |
| 7,415,056 B2* | 8/2008 | Das et al. | 372/55 |
| 7,423,275 B2* | 9/2008 | Lee et al. | 250/492.2 |
| 7,439,530 B2 | 10/2008 | Ershov et al. | 250/504 R |
| 7,525,111 B2* | 4/2009 | Bowering | 250/504 R |
| 7,671,349 B2* | 3/2010 | Bykanov et al. | 250/504 R |
| 2005/0016679 A1 | 1/2005 | Ruzic et al. | 156/345.5 |
| 2005/0140945 A1* | 6/2005 | Banine et al. | 355/30 |
| 2005/0205810 A1* | 9/2005 | Akins et al. | 250/504 R |
| 2005/0259709 A1 | 11/2005 | Das et al. | 372/55 |
| 2005/0279946 A1* | 12/2005 | Rettig et al. | 250/396 ML |
| 2006/0012761 A1 | 1/2006 | Bakker et al. | 355/30 |
| 2006/0175558 A1 | 8/2006 | Bakker et al. | 250/492.2 |
| 2006/0219957 A1 | 10/2006 | Ershov et al. | 250/504 R |
| 2006/0249699 A1 | 11/2006 | Bowering et al. | 250/504 R |
| 2006/0250599 A1 | 11/2006 | Bakker et al. | 355/67 |
| 2006/0255298 A1 | 11/2006 | Bykanov et al. | 250/504 R |
| 2007/0001131 A1 | 1/2007 | Ershov et al. | 250/503.1 |
| 2007/0023709 A1* | 2/2007 | Kanazawa et al. | 250/504 R |
| 2007/0102653 A1 | 5/2007 | Bowering et al. | 250/540 R |
| 2007/0145297 A1 | 6/2007 | Freriks et al. | 250/492.2 |
| 2007/0158594 A1 | 7/2007 | Shirai et al. | 250/504 R |
| 2007/0228298 A1* | 10/2007 | Komori et al. | 250/493.1 |
| 2007/0291279 A1 | 12/2007 | Rafac | 356/508 |
| 2007/0291350 A1 | 12/2007 | Ershov et al. | 359/333 |
| 2008/0035865 A1* | 2/2008 | Komori et al. | 250/504 R |
| 2008/0043321 A1 | 2/2008 | Bowering et al. | 359/359 |
| 2008/0048133 A1 | 2/2008 | Bykanov et al. | 250/504 R |
| 2008/0087840 A1* | 4/2008 | Ueno et al. | 250/396 ML |
| 2008/0087847 A1 | 4/2008 | Bykanov et al. | 250/504 R |
| 2008/0149862 A1 | 6/2008 | Hansson et al. | 250/504 R |
| 2008/0179548 A1* | 7/2008 | Bykanov et al. | 250/504 R |
| 2009/0272917 A1* | 11/2009 | Soer et al. | 250/492.1 |

FOREIGN PATENT DOCUMENTS

| | | |
|---|---|---|
| EP | 1491963 A1 | 12/2004 |
| EP | 1674932 A1 | 1/2008 |
| JP | 2006-329664 | 12/2006 |
| JP | 2007-220949 | 8/2007 |
| JP | 2007-317598 | 12/2007 |
| WO | WO03/087867 | 10/2003 |
| WO | WO2004/092693 | 10/2004 |
| WO | WO2005/064401 | 10/2004 |
| WO | WO2005/091879 | 10/2005 |

OTHER PUBLICATIONS

Wang, et al ("2-D Magnetic Circuit Analysis for a Permanent Magnet Used in Laser Ablation Plume Expansion Experiments" Fusion Division, Center for Energy Research, Univ. of CA, San Diego, UCSD-LPLM-02-04 (2002).*

U.S. Appl. No. 11/786,145, filed Apr. 10, 2007, Bykanov et al.

U.S. Appl. No. 11/827,803, filed Jul. 13, 2007, Vaschenko.

U.S. Appl. No. 11/897,644, filed Aug. 31, 2007, Bykanov et al.

U.S. Appl. No. 12/214,736, filed Jun. 19, 2008, Vaschenko et al.

Harilal, et al., "Ion debris mitigation from tin plasma using ambient gas, magnetic field and combined effects," J. Appl. Phys. B—Lasers and Optics, pp. 1-7; *Center for Energy Research*, Univ. of Calif, San Diego (2006).

Harilal, et al., "Spectroscopic characterization of laser-induced tin plasma," J. of Appl. Phys. 98 (1), 013306, pp. 1-7, *Univ. of Calif. Postprints*, paper 857 (2005).

Harilal, et al., "Debris mitigation in a laser-produced tin plume using a magnetic field," J. of App. Phys., 98, 036102, pp. 1-3, *American Institute of Physics* (2005).

Harilal, et al., "Ambient gas effects on the dynamics of laser-produced tin plume expansion," J. of App. Physics, 99, 083303, pp. 1-10, *American Institute of Physics* (2006).

Hershcovitch, "High-pressure arcs as vacuum-atmosphere interface and plasma lens for nonvacuum electron beam welding machines, electron beam melting, and nonvacuum ion material modification," J. Appl. Phys. 78 (9), pp. 5283-5288, *American Institute of Physics* (1995).

Tao, et al., "Mitigation of fast ions from laser-produced Sn plasma for an extreme ultraviolet lithography source," in App. Physics Letters 89, 111502, *American Institute of Physics* (2006).

Tao, et al., "Characterizing and optimizing the density profile of double-pulse laser-produced Sn-based plasmas to enhance conversion efficiency and mitigate debris for an EUVL source," Center for Energy Research, Univ. of Calif., UCSD-CER-05-07 (2005).

Tao, et al., "A mass-limited Sn target irradiated by dual laser pulses for an extreme ultraviolet lithography source," in Optics Lett., Doc ID: 78008, pp. 1-12 (2007).

Tillack, et al., "Debris mitigation for solid target LPP—Recent results at UCSD," EUV Source Workshop at Univ. of CA, San Diego (2005).

Wang, et al., "2-D Magnetic Circuit Analysis for a Permanent Magnet Used in Laser Ablation Plume Expansion Experiments," Fusion Division, Center for Energy Research, Univ. of CA, San Diego, UCSD-LPLM-02-04 (2002).

\* cited by examiner

DEBRIS PROTECTION SYSTEM HAVING A MAGNETIC FIELD FOR AN EUV LIGHT SOURCE

FIELD

The present disclosure relates to extreme ultraviolet ("EUV") light sources that provide EUV light from a plasma that is created from a target material and collected and directed to an intermediate region for utilization outside of the EUV light source chamber, e.g., by a lithography scanner/stepper.

BACKGROUND

Extreme ultraviolet light, e.g., electromagnetic radiation having wavelengths of around 50 nm or less (also sometimes referred to as soft x-rays), and including light at a wavelength of about 13.5 nm, can be used in photolithography processes to produce extremely small features in substrates, e.g., silicon wafers.

Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a target material, such as a droplet, stream or cluster of material having the required line-emitting element, with a laser beam.

In more theoretical terms, LPP light sources generate EUV radiation by depositing laser energy into a source element, such as xenon (Xe), tin (Sn) or lithium (Li), creating a highly ionized plasma with electron temperatures of several 10's of eV's. The energetic radiation generated during de-excitation and recombination of these ions is emitted from the plasma in all directions. In one common arrangement, a near-normal-incidence mirror is positioned at a distance from the plasma to collect, direct (and in some arrangements, focus) the light to an intermediate location, e.g., focal point. The collected light may then be relayed from the intermediate location to a set of scanner optics and ultimately to a wafer. In a typical setup, the EUV light must travel within the light source about 1-2 m from the plasma to the intermediate location, and as a consequence, it may be advantageous, in certain circumstances, to use gases in the light source chamber that have a relatively low absorptance of in-band EUV light. In one configuration, the laser beam may be focused through a central opening of the collector mirror onto a droplet target for plasma generation. The EUV radiation emitted in the backwards direction is then reflected at near-normal incidence by the collector mirror and directed to the intermediate location. One advantage of this configuration is that a relatively large mass collector shell with a large thermal load capacity and low deformation potential can be employed that can be controlled by thermal management from the mirror's backside.

For the above-described configuration, a collector mirror having a graded coating (which for some applications may include interface-engineered multi-layers for high-temperature-stability) is typically employed to provide relatively high EUV reflectivity at varying angles of incidence. These near-normal incidence (NI) collector mirrors tend to exhibit good thermal load capacity as well as good image fidelity under high heat load. The multi-layer (ML) coating may also provide substantial spectral filtering of out-of-band (OOB) EUV radiation. In addition, the ML coating can be stacked, or the number of layer periods can be increased, providing sacrificial layers that extend the useful lifetime of the NI collector.

For EUV light sources designed for use in high volume manufacturing (HVM) environments, the lifetime of the collector mirror is a critical parameter affecting efficiency, downtime, and ultimately, cost. During operation, debris are generated as a by-product of the plasma which can degrade the collector mirror surface. These debris can be in the form of high-energy ions, neutral atoms and clusters of target material. Of these three types of debris, the most hazardous for the collector mirror coating is typically the ion flux. Generally, for the configuration described above, the amount of neutral atoms and clusters from the droplet target impinging onto the collector may be small since most of the target material moves in a direction pointing away from the collector surface, (i.e., in the direction of the laser beam). In the absence of debris mitigation and/or collector cleaning techniques, the deposition of target materials and contaminants, as well as sputtering of the collector multilayer coating and implantation of incident particles, can reduce the reflectivity of the mirror substantially.

In more detail, the interaction of ions with energies of around a few kilo-electron volts with the surface results in erosion of the material of the MLM coating. In one study in which debris mitigation was not employed, an erosion rate of ~0.2 layers per million pulses was observed. This layer removal can be attributed to sputtering during impact of energetic particles emitted from the plasma. As indicated above, the collector mirror coating can include sacrificial layers and still provide full EUV reflectivity. Assuming an erosion rate of 0.2 layers/Mpulses and 500 sacrificial layers, an unprotected collector would only be useful for about $2.2 \times 10^9$ pulses, which corresponds to a lifetime of only about 2 days in a HVM environment at a repetition rate of 50 kHz.

With the above in mind, applicants disclose systems and methods for target material delivery in a laser produced plasma EUV light source, and corresponding methods of use.

SUMMARY

In a first aspect, a device may comprise a vessel; a material disposed in the vessel for creating an EUV light emitting plasma at a plasma site, the plasma generating debris; a near normal incidence EUV reflective optic disposed in the vessel; a trap disposed in the vessel, the trap having a plurality of spaced apart vanes; and a source of a magnetic field for deflecting debris in the vessel to protect the optic, the source positioned to interpose the optic between the source and the plasma site.

In one embodiment of this aspect, the magnetic field source may comprise a spiral coil substantially conforming to the shape of the reflective optic and a current source passing electrical current through the coil. The magnetic field source may further comprise a return yoke.

In one arrangement, the near normal incidence EUV reflective optic may have a reflective surface shaped as a portion of a prolate spheroid.

In a particular embodiment, the trap may be disposed between the plasma site and the reflective optic.

For one embodiment, the device may further comprise a flowing buffer gas at a gas number density, n, between the plasma and optic, the gas number density, n, being sufficient to combine with the trap and magnetic field to protect the optic from substantially all plasma emitted ions.

In another aspect, a device may comprise a vessel; a material disposed in the vessel for creating an EUV light emitting plasma, the plasma generating debris; a near normal incidence EUV reflective optic disposed in the vessel producing a cone of reflected EUV light directed toward an intermediate region; and a source of a magnetic field for deflecting debris in the vessel to protect the optic, the source comprising a plurality of magnets positioned in the light cone.

In one embodiment, the plurality of magnets may comprise a first magnet having a first magnetization direction and a second magnet having a second magnetization direction, the first and second magnets aligned with the first magnetization direction substantially parallel to the second magnetization direction.

In a particular embodiment, the first and second magnets may be permanent magnets.

In one arrangement, the first magnet may be coupled to the second magnet by a yoke.

In one setup, the plurality of magnets may further comprise a third magnet and in a particular setup, the third magnet may have a third magnetization direction and the third magnetization direction may be substantially normal to the first magnetization direction.

In another arrangement, the plurality of magnets may comprise a first magnet having a first magnetization direction and a second magnet having a second magnetization direction, with the first and second magnets aligned with the first magnetization direction substantially anti-parallel to the second magnetization direction. In one embodiment of this arrangement, the first and second magnets may be permanent magnets with the first magnet coupled to the second magnet by a yoke. In one setup of this arrangement, the plurality of magnets may further comprise a third magnet with the third magnet having a third magnetization direction with the third magnetization direction substantially normal to the first magnetization direction.

For this aspect, the device may further comprise a system cooling at least one of the magnets.

For this aspect, the device may further comprise a flowing buffer gas at a gas number density, n, between the plasma and optic, the gas number density, n, being sufficient to combine with the magnetic field to protect the optic from substantially all plasma emitted ions.

In yet another aspect, a device may comprise a vessel; a material disposed in the vessel for creating an EUV light emitting plasma at a plasma site, the plasma generating ions having initial ion energies; a near normal incidence EUV reflective optic disposed in the vessel; a system introducing buffer gas into the vessel, flowing the gas between the optic and the plasma site, and exhausting gas from the vessel to slow each ion to less than one-quarter of the ion's initial energy and remove heat from the vessel; and a source of a magnetic field for deflecting reduced energy ions in the vessel.

In one embodiment, the gas may comprise hydrogen at a number density equivalent to a pressure of about 0.1 Torr or greater at room temperature, and in a particular embodiment the gas may flow at a gas flow rate greater than 100 sccm.

DETAILED DESCRIPTION

Figure 1:
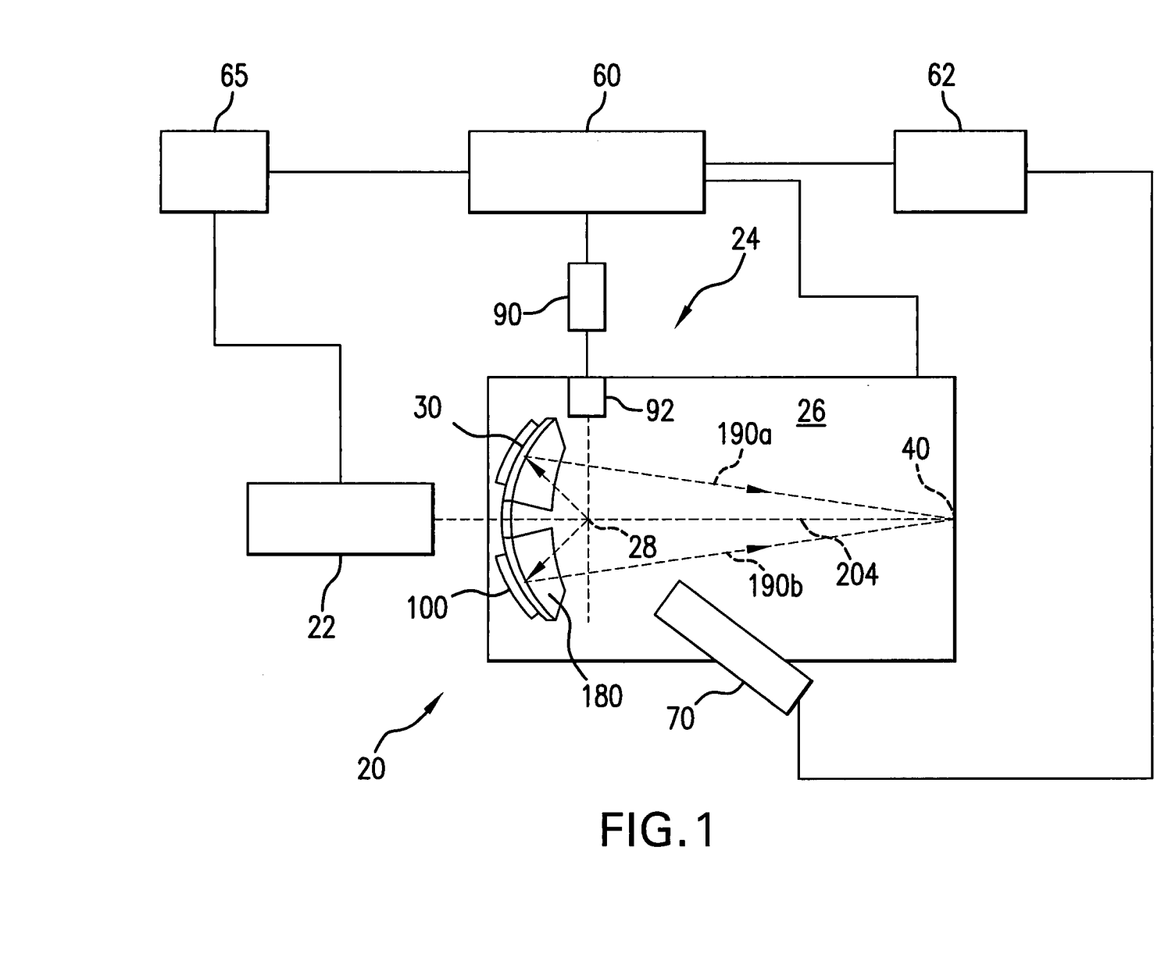
FIG. 1 shows a simplified, schematic view of the major components of a laser produced plasma EUV light source having a magnetic field source and a trap for protecting a surface of an EUV light source collector mirror from plasma generated debris.

With initial reference to FIG. 1, there is shown a schematic view of an EUV light source, e.g., a laser-produced-plasma EUV light source 20, according to one aspect of an embodiment. As shown in FIG. 1, and described in further detail below, the LPP light source 20 may include a system 22 for generating a train of light pulses and delivering the light pulses into a vessel having a chamber 26. As detailed below, each light pulse may travel along a beam path from the system 22 and into the chamber 26 to illuminate a respective target droplet at an irradiation region 28.

Suitable lasers for use in the system 22 shown in FIG. 1, may include a pulsed laser device, e.g., a pulsed gas discharge $CO_2$ laser device producing radiation at 9.3 µm or 10.6 µm, e.g., with DC or RF excitation, operating at relatively high power, e.g., 10 kW or higher and high pulse repetition rate, e.g., 50 kHz or more. In one particular implementation, the laser may be an axial-flow RF-pumped $CO_2$ laser having a MOPA configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, and/or focused before reaching the irradiation region 28. Continuously pumped $CO_2$ amplifiers may be used for the system 22. For example, a suitable $CO_2$ laser device having an oscillator and three amplifiers (O-PA1-PA2-PA3 configuration) is disclosed in U.S. patent application Ser. No. 11/174,299 filed on Jun. 29, 2005, entitled, LPP EUV LIGHT SOURCE DRIVE LASER SYSTEM, the entire contents of which are hereby incorporated by reference herein. Alternatively, the laser may be configured as a so-called "self-targeting" laser system in which the droplet serves as one mirror of the optical cavity. In some "self-targeting" arrangements, a master oscillator may not be required. Self-targeting laser systems are disclosed and claimed in U.S. patent application Ser. No. 11/580,414 filed on Oct. 13, 2006, entitled, DRIVE LASER DELIVERY SYSTEMS FOR EUV LIGHT SOURCE, the entire contents of which are hereby incorporated by reference herein.

Depending on the application, other types of lasers may also be suitable, e.g., an excimer or molecular fluorine laser operating at high power and high pulse repetition rate. Other examples include, a solid state laser, e.g., having a fiber, rod or disk shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, a power oscillator/power amplifier (POPA) arrangement, or a solid state laser that seeds one or more excimer or molecular fluorine amplifier or oscillator chambers, may be suitable. Other designs are possible.

As further shown in FIG. 1, the EUV light source 20 may also include a target material delivery system 24, e.g., delivering droplets of a target material into the chamber 26 to the irradiation region 28, where the droplets will interact with one or more light pulses, e.g., zero, one or more pre-pulses, and thereafter, one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in U.S. patent application Ser. No. 11/406,216, filed on Apr. 17, 2006, entitled ALTERNATIVE FUELS FOR EUV LIGHT SOURCE, the contents of which are hereby incorporated by reference herein.

Continuing with FIG. 1, the EUV light source 20 may also include an optic 30, e.g., a near-normal incidence collector mirror having a reflective surface in the form of a prolate spheroid (i.e., an ellipse rotated about its major axis) having, e.g., a graded multi-layer coating with alternating layers of molybdenum and silicon, and in some cases one or more high temperature diffusion barrier layers, smoothing layers, capping layers and/or etch stop layers. FIG. 1 shows that the optic 30 may be formed with an aperture to allow the light pulses generated by the system 22 to pass through and reach the irradiation region 28. As shown, the optic 30 may have a reflective surface shaped as a prolate spheroid that has a first focus within or near the irradiation region 28, and a second focus at a so-called intermediate region 40, where the EUV light may be output from the EUV light source 20 and input to a device utilizing EUV light, e.g., an integrated circuit lithography tool (not shown). It is to be appreciated that other optics may be used in place of, or in addition to, the prolate spheroid mirror for collecting and directing light to an intermediate location for subsequent delivery to a device utilizing EUV light. For example, the optic may be a rotated-parabola or may be configured to deliver a beam having a ring-shaped cross-section to an intermediate location, see e.g., U.S. patent application Ser. No. 11/505,177, filed on Aug. 16, 2006, entitled EUV OPTICS, the contents of which are hereby incorporated by reference herein.

Continuing with reference to FIG. 1, the EUV light source 20 may also include an EUV controller 60, which may also include a firing control system 65 for triggering one or more lamps and/or laser devices in the system 22 to thereby generate light pulses for delivery into the chamber 26. The EUV light source 20 may also include a droplet position detection system which may include one or more droplet imagers 70, and/or light curtains that provide an output indicative of the position and/or timing of one or more droplets, e.g., relative to the irradiation region 28. The imager(s) 70 may provide this output to a droplet position detection feedback system 62, which can, e.g., compute a droplet position and trajectory, from which a droplet error can be computed, e.g., on a droplet-by-droplet basis, or on average. The droplet error may then be provided as an input to the controller 60, which can, for example, provide a position, direction and/or timing correction signal to the system 22 to control a source timing circuit and/or to control a beam position and shaping system, e.g., to change the trajectory and/or focal power of the light pulses being delivered to the irradiation region 28 in the chamber 26.

The EUV light source 20 may include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc. For the EUV light source 20, the instrument(s) may be configured to operate while the downstream tool, e.g., photolithography scanner, is on-line, e.g., by sampling a portion of the EUV output, e.g., using a pick off mirror or sampling "uncollected" EUV light, and/or may operate while the downstream tool, e.g., photolithography scanner, is off-line, for example, by measuring the entire EUV output of the EUV light source 20.

As further shown in FIG. 1, the EUV light source 20 may include a droplet control system 90, operable in response to a signal (which in some implementations may include the droplet error described above, or some quantity derived therefrom) from the controller 60, to e.g., modify the release point of the target material from a source material dispenser 92 and/or modify droplet formation timing, to correct for errors in the droplets arriving at the desired irradiation region 28 and/or synchronize the generation of droplets with the pulsed laser system 22.

More details regarding various droplet dispenser configurations and their relative advantages may be found in U.S. patent application Ser. No. 11/827,803 filed on Jul. 13, 2007, entitled LASER PRODUCED PLASMA EUV LIGHT SOURCE HAVING A DROPLET STREAM PRODUCED USING A MODULATED DISTURBANCE WAVE, U.S. patent application Ser. No. 11/358,988 filed on Feb. 21, 2006, entitled LASER PRODUCED PLASMA EUV LIGHT SOURCE WITH PRE-PULSE, U.S. patent application Ser. No. 11/067,124 filed on Feb. 25, 2005, entitled METHOD AND APPARATUS FOR EUV PLASMA SOURCE TARGET DELIVERY, and U.S. patent application Ser. No. 11/174,443 filed on Jun. 29, 2005, entitled LPP EUV PLASMA SOURCE MATERIAL TARGET DELIVERY SYSTEM, the contents of each of which are hereby incorporated by reference.

As shown schematically in FIG. 1, and described in more detail below, a system may be provided for protecting an EUV light source internal component, which for the embodiment shown in FIG. 1 may be a collector mirror 30, from charged species, e.g. ions generated at a plasma formation region 28 and initially directed toward the component, e.g. collector mirror 30. As shown, the system may include a magnetic field source 100 (shown schematically in FIG. 1) and a trap 180 that is disposed in the chamber 26. As shown, the magnetic field source 100 may be positioned such to interpose the mirror 30 between the source 100 and the plasma site. With this arrangement, the source 100 does not block EUV light generated at the irradiation region 28 from reflecting from the mirror 30 and reaching the intermediate focus 40.

Although the system is shown in a configuration to protect a surface of an EUV light source collector mirror 30, it is to be appreciated that the system as described herein can be used to protect other optical elements including, but not limited to, the laser input window, imaging windows for imagers and/or an input surface of a metrology monitor (not shown).

Figure 2:
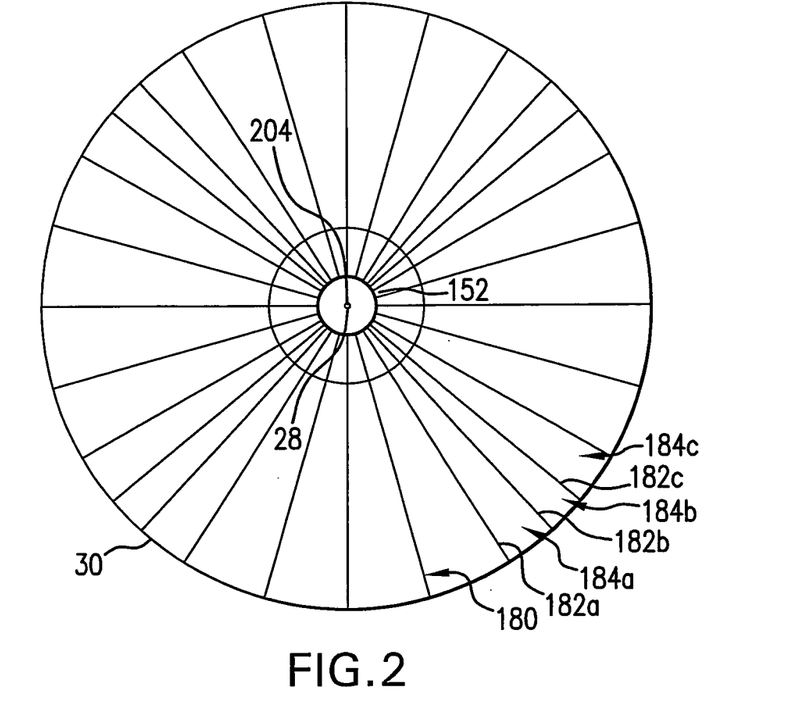
FIG. 2 shows a schematic side view illustrating the trap shown in FIG. 1 as seen from a vantage point at the intermediate region 40 in FIG. 1.

FIG. 2 shows in more detail a trap 180 which may be used in the system shown in FIG. 1. Specifically, FIG. 2 shows a schematic view of a collector mirror 30 and trap 180 as would be seen if looking into the collector mirror 30 from a vantage point at the intermediate region 40 (See FIG. 1). As shown in FIG. 2, the collection mirror 30 is circular in cross-section looking at the mirror, and as shown in FIG. 1, may define a major axis 204 normal to the circular cross-section which includes focal point (irradiation region 28) of the mirror 30. The mirror may also have an aperture 152, e.g., shown to be circular in FIG. 2, to allow passage of the laser beam through the mirror 30 to the irradiation region 28.

As shown in FIG. 2, the trap 180 may be made-up of a plurality spaced-apart vanes, e.g., thin plates or foils, of which exemplary plates 182a-c have been labeled. For example, the plates may be made of molybdenum. As best seen in FIG. 2, each plate 182a-c may extend substantially radially outward from the axis 204, and, as shown in FIG. 1, each plate of the debris trap 180 may be interposed between the irradiation region 28 and the collector mirror 30. It can be further seen in FIG. 2 that a light transmitting channel (exemplary channels 184a-c have been labeled) may be established between each pair of adjacent plates 182a-c allowing EUV light to pass through the trap 180. Although the trap 180 shown in FIG. 2 includes twenty-eight plates, it is to be appreciated that more than twenty-eight, and as few as one plate may be used. Additional plates may, in some cases, result in greater debris capture, however, the addition of plates may also reduce the channel size, and thus, allow less EUV light to pass through the trap 180.

Cross-referencing FIG. 1 with FIG. 2, the functionality of the radially aligned channels 184a-c in the debris trap 180 can be seen. FIG. 1 shows exemplary paths for two EUV light rays 190a,b emitted from the irradiation region 28. As shown, each ray travels from the irradiation region 28 and may pass through a channel 184 in the debris trap 180. Upon striking the surface of the mirror 30, at any angle of incidence, the ray 190a may be reflected back within the same channel 184 as a reflected ray and be directed to the intermediate focus 40. Additional information regarding debris traps and associated structures may be found in U.S. Pat. No. 7,217,941 filed on Jun. 8, 2005, entitled SYSTEMS AND METHODS FOR DEFLECTING PLASMA-GENERATED IONS TO PREVENT THE IONS FROM REACHING AN INTERNAL COMPONENT OF AN EUV LIGHT SOURCE, the contents of which is hereby incorporated by reference.

Figure 3:
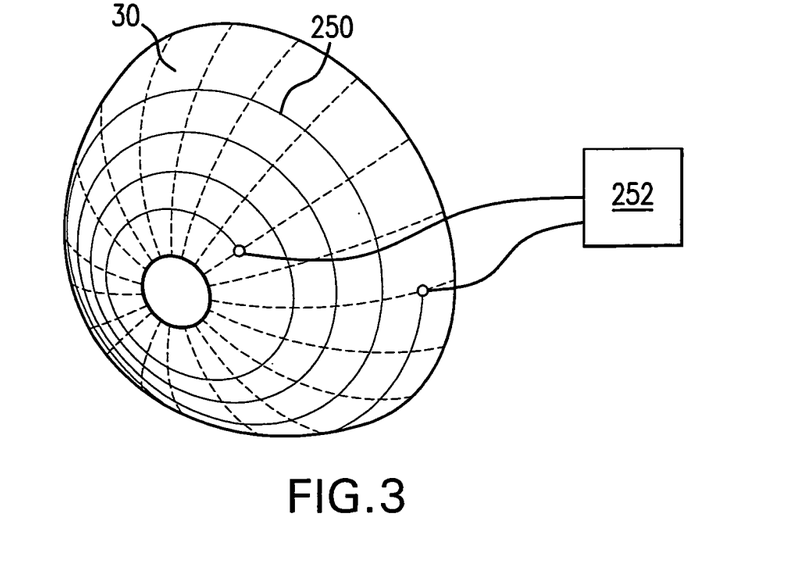
FIG. 3 shows a perspective view of a collector mirror backside illustrating a magnetic field source having a conductive spiral coil with approximately five turns overlaying the collector mirror backside and substantially conforming to the shape of the mirror backside.
Figure 4:
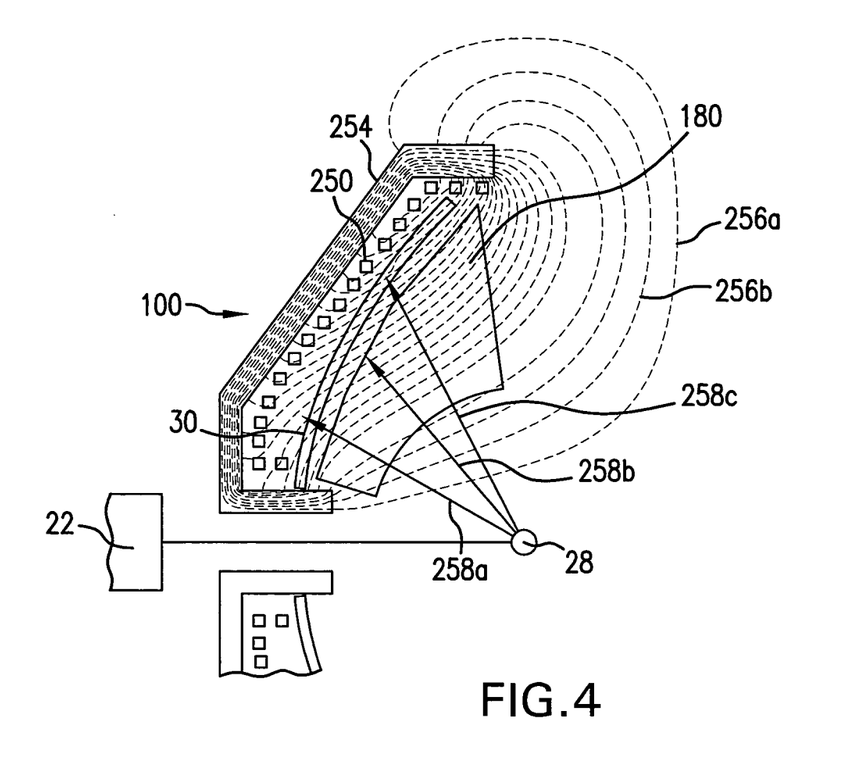
FIG. 4 is a sectional, detail view showing a magnetic field calculated for spiral coil similar to the one shown in FIG. 3 but with approximately 18 turns.

FIGS. 3 and 4 illustrate an example of a magnetic field source 100 for generating a magnetic field in the chamber between the mirror 30 and irradiation region 28. As shown, the source 100 may include a conductive spiral coil 250 overlaying the collector mirror backside and, as shown, may substantially conform to the shape of the mirror 30, e.g. a prolate spheroid. Also shown, a current source 252 may be connected via wires to the coil 250 and a return yoke 254 may be provided to further shape the resulting magnetic field. FIG. 4 shows representative field lines, of which lines 256a,b are labeled, calculated using finite element analysis (FEA) code for the spiral coil-return yoke source 100 shown. As shown there, the field generated is aligned approximately normal to the direction of exemplary ion paths 258a-c. With this arrangement, some or all of the ions directed toward the mirror 30 from the plasma will be deflected into the plates 182a,b of the trap 180 as shown in FIG. 5.

Figure 5:
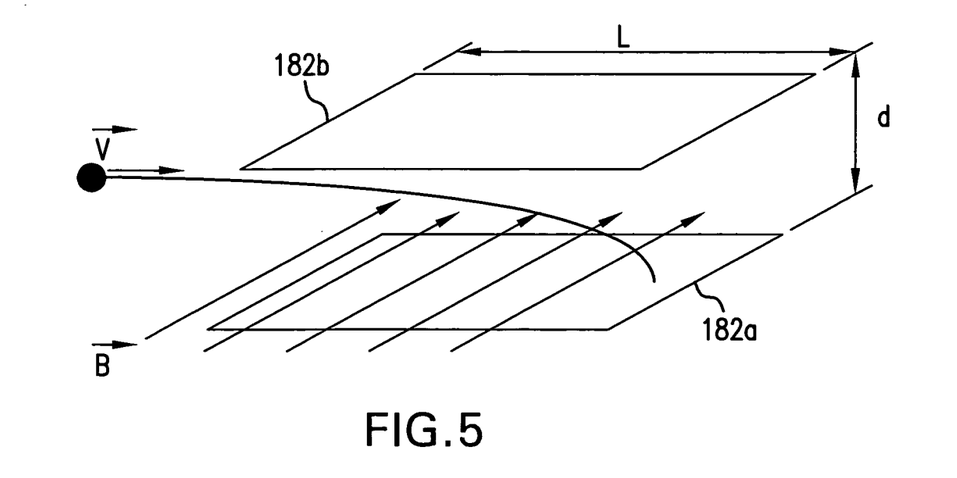
FIG. 5 shows a pair of adjacent trap vanes for the arrangement shown in FIGS. 1-4 and illustrates the interaction between a charged species having velocity, V, in the magnetic field, B.

For the arrangement shown in FIG. 5, the magnetic field may be calculated by the formula:

$$B = \frac{2d}{L^2}\sqrt{\frac{2ME_i}{eZ^2}}$$

where e is the elementary charge, $E_i$ is the ion energy, M is the ion mass, d is the spacing between vanes and L is the ion path length along a vane. For example, consider the case where the ions have maximum energy, E=3 keV, charge Z=1, a collector mirror located at about 200 mm from plasma, and a trap having radius of 150 mm with 360 vanes. For this case, L=50 mm (this is minimum length near the axis) and d/L=0.02. With these parameters, a magnetic field of about 70 mT will successfully deflect the 3 KeV ions into the trap. Continuing with this example, a FEA calculation of the magnetic field shows that for an 18 turn spiral coil with a return yoke, a current of about 2 kA will generate a 70 mT field. For copper turns having a 1 cm-by-1 cm cross-section, calculated power losses are approximately 3 kW. This estimation shows that the suggested magnetic field configuration for collector mirror protection against ions in combination with the trap is feasible without necessarily using super-conductive magnets and the associated cryogenic system.

Figure 6:
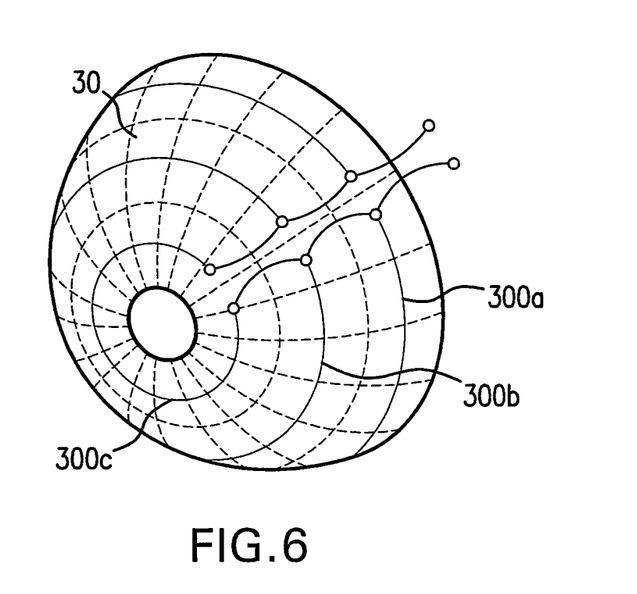
FIG. 6 shows a perspective view of a collector mirror backside illustrating an alternative embodiment of a magnetic field source having conductive coils overlaying the collector mirror backside and substantially conforming to the shape of the mirror backside.

FIG. 6 shows an alternate arrangement in which the source 100 of FIG. 1 may include a plurality of coils 300a-c positioned to overlaying the collector mirror backside. As shown, the coils 300a-c may substantially conform to the shape of the mirror 30, e.g. a prolate spheroid. A current source (as shown in FIG. 3) may be connected via wires to the coils 300a-c and a return yoke (as shown in FIG. 4) may be provided to further shape the magnetic field. With this arrangement, a field similar to the field shown in FIG. 4 may be obtained. Although the system shown in FIG. 6 includes three coils 300a-c, it is to be appreciated that many more than three, e.g., eighteen, and as few as one coil may be used.

Figure 7:
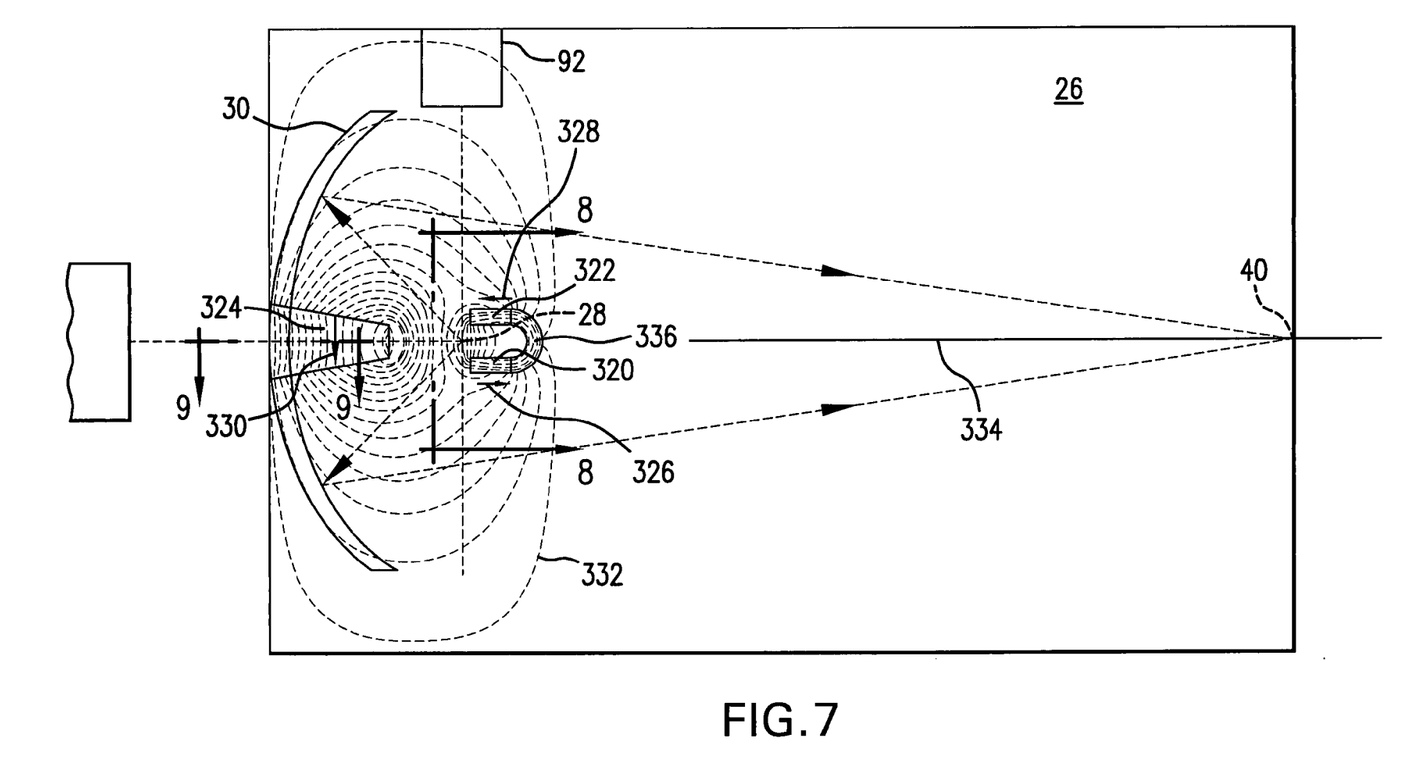
FIG. 7 shows an embodiment of a system for protecting an EUV light source internal component from debris generated at plasma formation site having a plurality of magnets.

FIG. 7 shows another embodiment of a system for protecting an EUV light source internal component (which for the embodiment shown in FIG. 7 may be a collector mirror 30), from a charged species, e.g. ions generated at plasma formation region 28 and initially directed toward the component, e.g., collector mirror 30 (or neutrals that are subsequently charged—see discussion below). As shown, the system may include a plurality of magnets 320, 322, 324, which are magnetized in the direction of arrows 326, 328, 330 respectfully, for creating a magnetic field (illustrated by calculated field lines 332) in the chamber 26 between the region 28 and mirror 30. For the system shown, magnets 320, 322, 324 may be permanent magnets, e.g. made of $SmCo_5$ material.

For the arrangement shown in FIG. 7, magnet 320 may be aligned relative to magnet 322 such that the magnetization direction of magnet 320 (arrow 326) is substantially anti-parallel to the magnetization direction of magnet 322 (arrow 328). Also shown, magnet 324 may be oriented such that the magnetization direction of magnet 324 (arrow 330) is substantially normal to the magnetization direction of magnet 320 (arrow 326).

Although the system shown in FIG. 7 is configured to protect a surface of an EUV light source collector mirror 30, it is to be appreciated that the system as described herein can be used to protect other optical elements including, but not limited to, the laser input window, imaging windows for imagers and/or an input surface of a metrology monitor (not shown).

Figure 8:
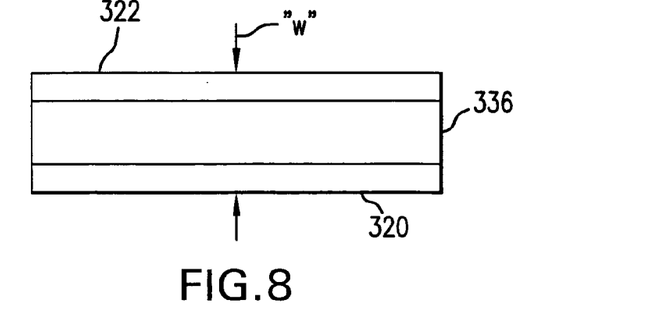
FIG. 8 is a view of two magnets and yoke as seen along line 8-8 in FIG. 7.

Cross-referencing FIGS. 7 and 8, it can be seen that the magnets 320 and 322 may be elongated and extend in a direction substantially normal to the major axis 334 of the mirror 30 (which for the embodiment shown is shaped as a prolate spheroid) and may be coupled to a yoke 336. Cross-referencing FIGS. 7 and 8, it can be seen that magnet 324 may also be elongated, may extend from a location near one edge of the collector to a location near an opposing edge, and may be shaped to conform to the collector surface, as shown. A passageway may be formed in magnet 324 to allow light pulses from source 22 to pass to the irradiation region 28.

As shown, magnets 320 and 322 are positioned within the light cone of EUV light reflected by optic 30. However, the impact of the obscuration caused by the magnets may reduced by minimizing the width "w" (shown in FIG. 8) and/or aligning the magnets in a favorable orientation. For example, some scanner/light source designs may favor specific obscuration orientations, e.g. non-vertical, to align the obscuration with a pre-existing system obscuration (e.g., due to droplet stream obscurations, metrology related obscurations, etc.) and/or to produce an obscuration aligned relative to the scan direction which will create an intensity variation at the wafer which "averages out" over a scan and can be compensated by dose adjustment.

Figure 10:
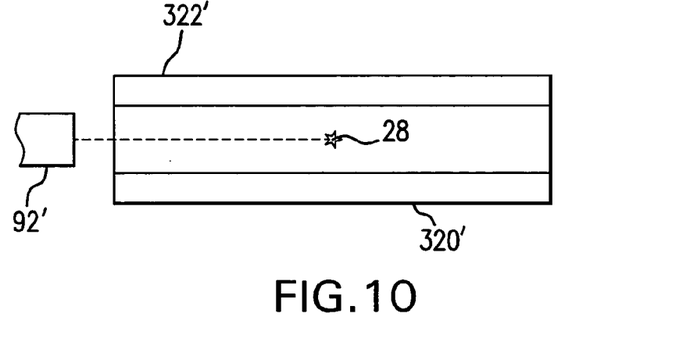
FIG. 10 shows an embodiment in which the magnets may be aligned parallel with the source material droplet stream.

FIG. 10 shows that the magnets 320' and 322' may be aligned parallel with the droplet stream from dispenser 92' to reduce obscurations. This alignment may be, for example, horizontal. Additional information regarding horizontal droplet generation and associated structures may be found in U.S. patent application Ser. No. 12/214,736 filed on Jun. 19, 2008, entitled SYSTEMS AND METHODS FOR TARGET MATERIAL DELIVERY IN A LASER PRODUCED PLASMA EUV LIGHT SOURCE, the contents of which is hereby incorporated by reference.

Figure 11:
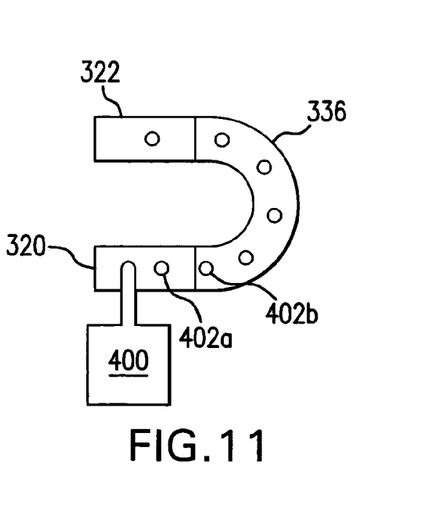
FIG. 11 illustrates a cooling system that may be provided to maintain the magnets and/or yoke within a selected operational temperature range.

FIG. 11 illustrates that a cooling system 400 may be provided to maintain the magnets 320, 322 and/or yoke 336 within a selected operational temperature range, e.g. below the curie temperature of the magnetic materials. As shown, the cooling system 400 may be configured to pass a heat exchange fluid through passageways 402a,b formed in the magnets 320, 322 and/or yoke 336. For example, the system may be designed to maintain $SmCo_5$ magnets below about 250 degrees C.

Figure 12:
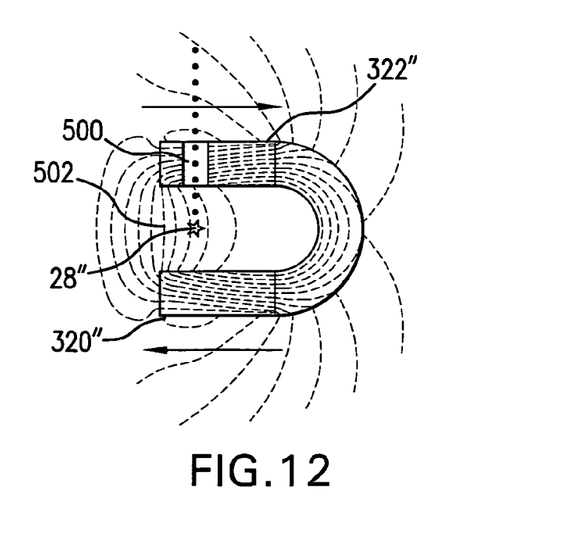
FIG. 12 shows that one of the magnets may be formed with a passageway to allow source material, e.g. tin, droplets to pass through the magnet to an irradiation region located between the two magnets.

FIG. 12 shows that the magnet 320" may be formed with a passageway 500 to allow source material, e.g. tin, droplets to pass through the magnet 320" to an irradiation region 28" located between magnet 320" and magnet 322". With this arrangement, the field (e.g., line 502) is normal to the ion direction at a location between the irradiation region 28" and the optic 30 (see FIG. 7).

Figure 13:
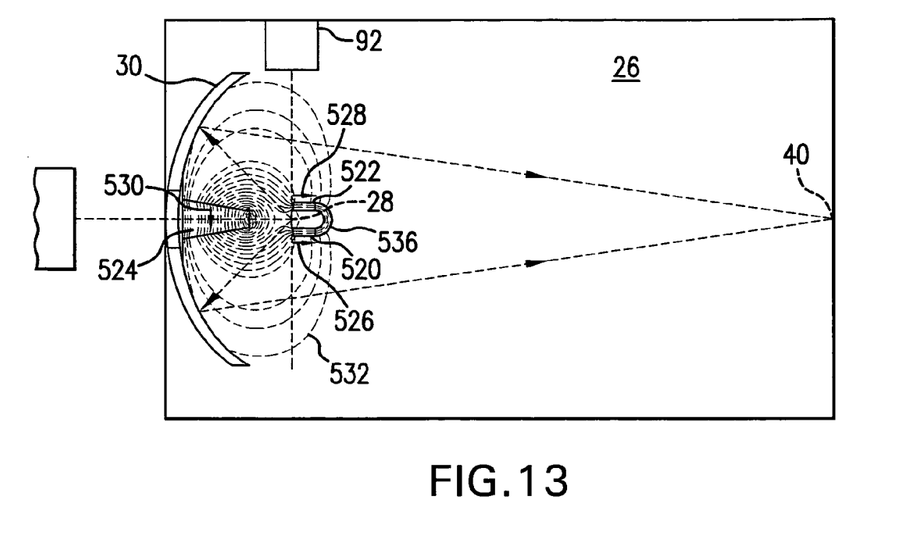
FIG. 13 shows another embodiment of a system for protecting an EUV light source internal component having one or more components in common with the device shown in FIG. 7, but having a first magnet aligned relative to a second magnet such that the magnetization direction of the first magnet is substantially parallel to the magnetization direction of the second magnet.

FIG. 13 shows another embodiment of a system for protecting an EUV light source internal component having one or more components in common with the device shown in FIG. 7, (which for the embodiment shown in FIG. 13 may be a collector mirror 30), from a charged species, e.g., ions generated at plasma formation region 28 and initially directed toward the component, e.g. collector mirror 30 (or neutrals that are subsequently charged—see discussion below). As shown, the system may include a plurality of magnets 520, 522, 524, which are magnetized in the direction of arrows 526, 528, 530 respectfully, for creating a magnetic field (illustrated by calculated field lines 532) in the chamber 26 between the region 28 and mirror 30. For the system shown, magnets 520, 522, 524 may be permanent magnets, e.g., made of SmCo material.

For the arrangement shown in FIG. 13, magnet 520 may be aligned relative to magnet 522 such that the magnetization direction of magnet 520 (arrow 526) is substantially parallel to the magnetization direction of magnet 522 (arrow 528). Also shown, magnet 524 may be oriented such that the magnetization direction of magnet 524 (arrow 530) is substantially normal to the magnetization direction of magnet 520 (arrow 526).

Although the system shown in FIG. 13 is configured to protect a surface of an EUV light source collector mirror 30, it is to be appreciated that the system as described herein, can be used to protect other optical elements including, but not limited to, the laser input window, imaging windows for imagers and/or an input surface of a metrology monitor (not shown).

Figure 9:
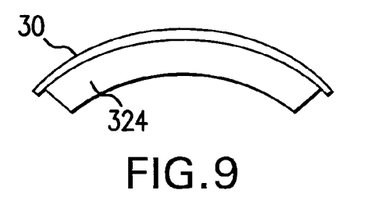
FIG. 9 is a sectional view of a magnet as seen along line 9-9 in FIG. 7.

Like the embodiment shown in FIG. 7, it can be seen that the magnets 520 and 522 of the FIG. 13 embodiment may be elongated and extend in a direction substantially normal to the major axis of the mirror 30 (which for the embodiment shown is shaped as a prolate spheroid), and may be coupled to a yoke 536 (see FIG. 8). Magnet 524 may also be elongated, may extend from a location near one edge of the collector to a location near an opposing edge, and may be shaped to conform to the collector surface (i.e., as shown in FIG. 9 for magnet 324). A passageway may be formed in magnet 524 to allow light pulses from source 22 to pass to the irradiation region 28. Also, magnets 520 and 552 may be aligned parallel with the droplet stream from dispenser 92 to reduce obscurations (i.e., as shown in FIG. 10 for magnets 320' and 322'). This alignment may be, for example, horizontal. A cooling system may be provided to maintain the magnets 520, 522 and/or yoke 536 within a selected operational temperature range, e.g., below the curie temperature of the magnetic materials (i.e., such as the system 400 shown in FIG. 11).

Figure 14:
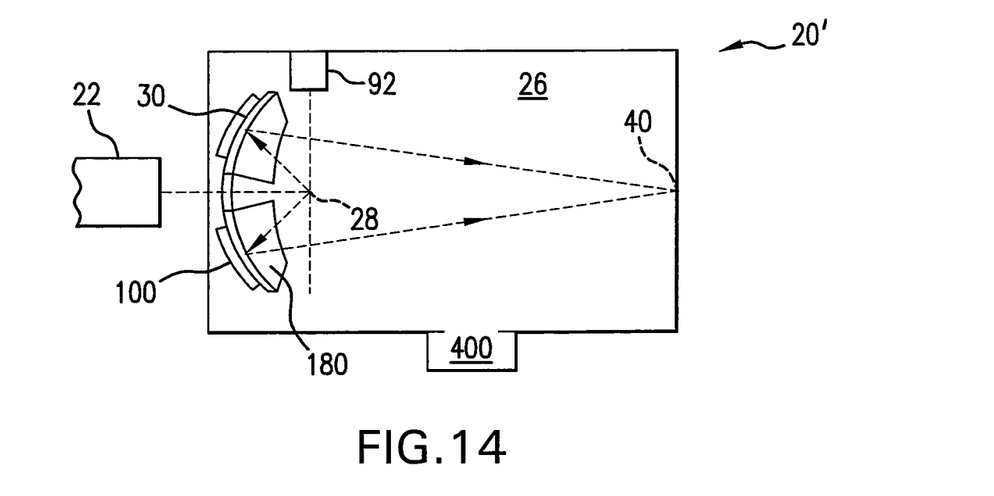
FIG. 14 shows a device having one or more components in common with the device shown in FIG. 1, such as a magnetic field source which cooperates with trap, and further includes a source for introducing a flowing buffer gas into the chamber.

FIG. 14 shows a device 20' having one or more components in common with the device shown in FIG. 1, such as a magnetic field source 100 (shown schematically in FIG. 14), which cooperates with trap 180 made-up of a plurality spaced-apart vanes, e.g., thin plates or foils (see also FIG. 2) that is disposed in the chamber 26. As shown, the magnetic field source 100 (see also FIG. 3-6), may be positioned to interpose the mirror 30 between the source 100 and the plasma site (i.e., irradiation region 28). With this arrangement, the source 100 does not block EUV light generated at the irradiation region 28 from reflecting from the mirror 30 and reaching the intermediate focus 40.

As shown, the embodiment shown in FIG. 14 may further include a gas system 600, e.g. including a gas source, input pump, regulator and/or exhaust pump, for introducing a flowing buffer gas into the chamber 26. Although a single gas system 600 is shown introducing gas into the chamber 26 at a single location, it is to be appreciated that gas may be introduced at another location or may be introduced at multiple locations using one or more gas systems 600.

For the device 20', a flowing buffer gas may be established at a gas number density, n, between the irradiation region 28 and mirror 30 sufficient to operate in combination with the trap 180 and magnetic field source 100, to protect the mirror 30 from substantially all plasma emitted ions. A number of parameters may affect the specified gas number density, including, the magnitude and configuration of the magnetic field, the number, length and spacing of the trap plates, the distance between the irradiation region 28 and mirror 30, the composition of the buffer gas and the maximum ion energy exiting the plasma (which may, in turn, depend on a number of factors including drive laser power, source material composition, droplet size, etc.).

In one setup, for a plasma generating ions having initial ion energies, a gas system 600 may be provided to introduce ion slowing gas, e.g. buffer gas, into the vessel and flow the gas between the optic 30 and the irradiation region 28 and exhaust gas from the vessel, to slow each ion to less than one-quarter of the ion's initial energy and remove heat from the vessel. For this setup, the magnetic field source 100 may be sized to deflect the reduced energy ions into the trap 180.

For the source 20' shown, a gas, e.g., flowing or static, may be disposed between the plasma site and trap 180, the gas establishing a gas number density, n, (i.e., number of molecules/volume) sufficient to operate over the distance, d, where d is the nearest distance between the plasma site and trap 180 to reduce ion energy to a target maximum energy level before the ions reach the trap 180.

For example, a gas number density sufficient to reduce ion energy to a target maximum energy level between about 10-200 eV, and in some cases below 30 eV may be provided. For operation of the device shown, it is contemplated that the gas establishing a target gas number density over the distance, d, will be present, and flowing, during EUV light generation. Factors which may be considered in selecting a suitable gas composition and gas number density include the ion stopping power of the gas composition (e.g., slowing ions below about 30 eV over a distance of about 10-30 cm), and the EUV absorption of the gas as a function of number density (e.g., for an LPP source, providing an acceptable in-band EUV absorption over a distance of about 1-2 m as the EUV light travels from the plasma to the collector mirror, and then onto the intermediate region 40.

Suitable gases may, depending on the specific application, include hydrogen e.g., greater than 50 percent hydrogen (protium and/or deuterium isotopes), helium and combinations thereof. For example, for a plasma generating ions having a maximum initial ion energy (e.g. about 5-10 keV) and distance, d, of about 15 cm from the plasma, a suitable gas for reducing ion energy below about 30 eV may be hydrogen gas at a number density equivalent to a pressure of about 500 mtorr at room temperature. For some arrangements, pressures at a number densities equivalent to pressures at room temperature (e.g. 25 degrees C.) in the range of about 100 mtorr to 2000 mtorr and flowing at a gas flow rate greater than about 100 sccm may be employed. SRIM (Stopping and Range of Ions in Matter) software (available at www-srim-org website) can be used to determine the gas number density (operable over a given distance, d) that is required to reduce the energy of an ion (having an initial ion energy) to below a selected energy. From the number density, the expected EUV absorption by the gas can be calculated. It is to be further appreciated that gas introduced into the chamber may react with light, ions and/or the plasma to dissociate and/or create ions, e.g., atomic hydrogen and/or hydrogen ions which may be effective for cleaning/etching and/or ion slowing.

Once the reduced ion energy (i.e., due to the ion slowing gas) is calculated, the required magnetic field can be determined (see also discussion above regarding FIG. 5) using the formula:

$$B = \frac{2d}{L^2}\sqrt{\frac{2ME_i}{eZ^2}}$$

For the source 20' shown, the gas system 600 may include a regulated gas source for introducing one or more gas(es) into the chamber 26, an adjustable pump for removing gas from the chamber 26, and, in some cases, a closed loop flow path cooling, filtering, recycling and/or re-introducing gas removed from the chamber 26. More details regarding ion slowing buffer gases and their uses and relative advantages may be found in U.S. patent application Ser. No. 11/786,145 filed on Apr. 10, 2007, entitled LASER PRODUCED PLASMA EUV LIGHT SOURCE, and U.S. patent application Ser. No. 11/897,644, filed on Aug. 31, 2007, entitled GAS MANAGEMENT SYSTEM FOR A LASER-PRODUCED PLASMA EUV LIGHT SOURCE, the contents of each of which are hereby incorporated by reference herein.

Figure 15:
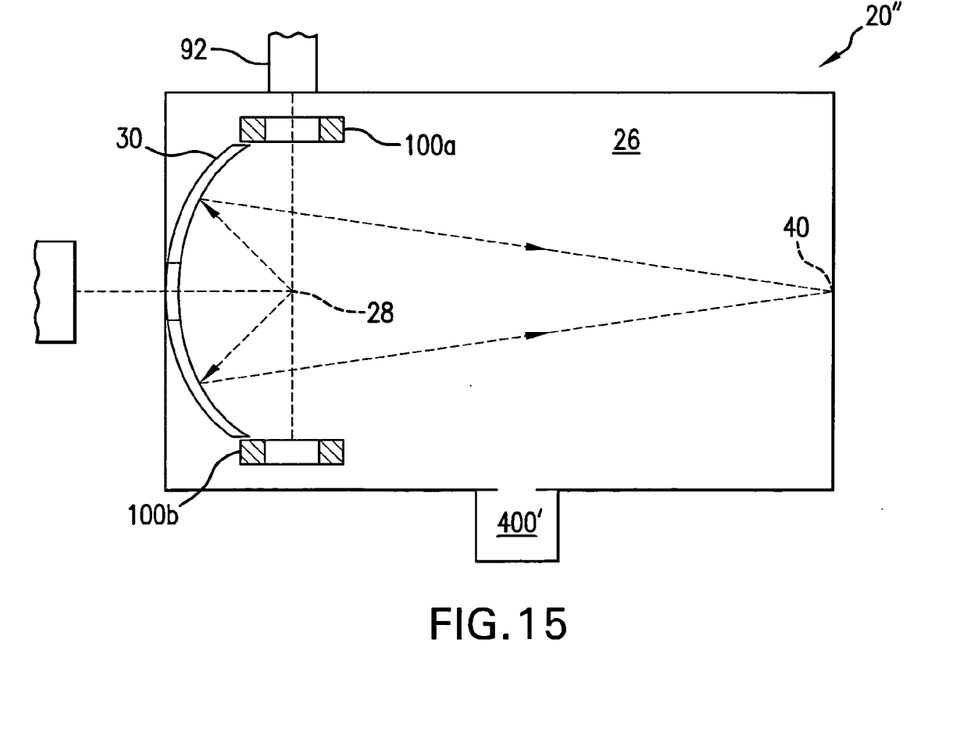
FIG. 15 shows a device having a magnetic field source having coils positioned outside of the EUV light cone which cooperates with a source for introducing a flowing buffer gas into the chamber to protect an optic from debris generated at an irradiation region.

FIG. 15 shows a device 20" having a magnetic field source having coils 100a,b) positioned outside of the EUV light cone which cooperates with a gas system 600' for introducing a flowing buffer gas into the chamber 26 to protect an optic 30 from debris generated at irradiation region 28. For example, the magnetic field source may employ superconducting coils to produce a magnetic field having a field strength in the range of about 0.01-2.5 T at the irradiation region 28. For the device 20", a flowing or static buffer gas may be established at a gas number density, n, between the irradiation region 28 and mirror 30 sufficient to operate in combination with the magnetic field source coils 100a,b to protect the mirror 30 from substantially all plasma emitted ions. A number of parameters may affect the specified gas number density, including, the magnitude and configuration of the magnetic field, the distance between the irradiation region 28 and mirror 30, the composition of the buffer gas and the maximum ion energy exiting the plasma (which may, in turn, depend on a number of factors including drive laser power, source material composition, droplet size, etc.).

In one setup, for a plasma generating ions having initial ion energies, a gas system 600 may be provided to introduce ion slowing gas, e.g., buffer gas, into the vessel and flow the gas between the optic 30 and the plasma region 28 and exhaust gas from the vessel to slow each ion to less than one-quarter of the ion's initial energy and remove heat from the vessel. For this setup, the magnetic field source 100 may be sized to deflect the reduced energy ions away from the optic 30.

Suitable gases may, depending on the specific application, include hydrogen e.g., greater than 50 percent hydrogen (protium and/or deuterium isotopes), helium and combinations thereof. For example, for a plasma generating ions having a maximum initial ion energy (e.g., about 3-5 keV) and an optic 30 at a distance, d, of about 15 cm from the plasma, a rough estimate may include gas for reducing ion energy may be hydrogen gas at a number density equivalent to a pressure at room temperature of about 200 mtorr and a magnetic field strength may be about 0.1 T at the irradiation site 28. For some arrangements, hydrogen at a number density equivalent to a pressure at room temperature in the range of about 100 mtorr to 2000 mtorr and flowing at a gas flow rate greater than about 100 sccm may be employed.

For the source 20" shown, the gas system 600' may include a regulated gas source for introducing one or more gas(es) into the chamber 26, an adjustable pump for removing gas from the chamber 26, and, in some cases, a closed loop flow path cooling, filtering, recycling and/or re-introducing gas removed from the chamber 26.

Figure 16:
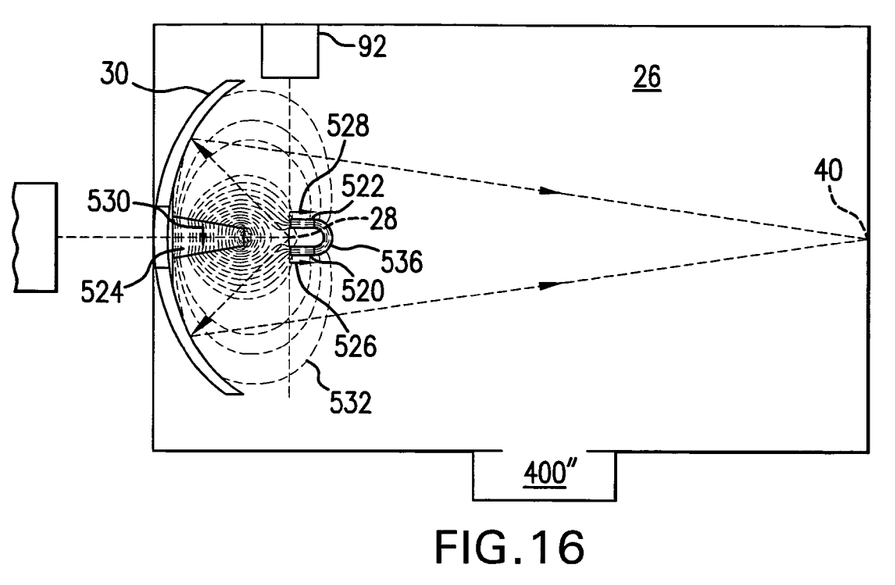
FIG. 16 illustrates that the embodiments shown in FIGS. 7 and 13 may also be used in conjunction with a source for introducing a flowing buffer gas into the chamber to protect an optic from debris generated at irradiation region.

FIG. 16 illustrates that the embodiment shown in FIGS. 7 and 13 may also be used in conjunction with a gas system 600" for introducing a flowing buffer gas into the chamber 26 to protect an optic 30 from debris generated at irradiation region 28. As provided above, use of an ion slowing buffer gas may reduce the strength of the magnetic field required to protect the optic 30.

Figure 17:
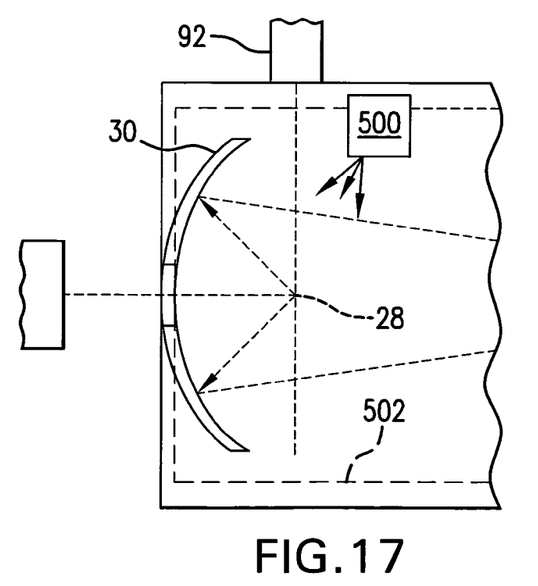
FIG. 17 illustrates that an ionizing system for placing a charge on neutrals may be provided in any one of the embodiments shown in FIGS. 1-16, and described above.

FIG. 17 illustrates that an ionizing system 500 for placing a charge on neutrals may be provided in any one of the embodiments shown in FIGS. 1-16 and described above. As shown, the system 500 may operate to charge neutrals allowing these particles to then be deflected by the magnetic field 502. For example, the system 500 can be a source of ionizing radiation such as microwave radiation or x-ray radiation.

While the particular embodiment(s) described and illustrated in this patent application in the detail required to satisfy 35 U.S.C. §112, are fully capable of attaining one or more of the above-described purposes for, problems to be solved by, or any other reasons for, or objects of the embodiment(s) described above, it is to be understood by those skilled in the art that the above-described embodiment(s) are merely exemplary, illustrative and representative of the subject matter which is broadly contemplated by the present application. Reference to an element in the following Claims in the singular, is not intended to mean, nor shall it mean in interpreting such Claim element "one and only one" unless explicitly so stated, but rather "one or more". All structural and functional equivalents to any of the elements of the above-described embodiment(s) that are known, or later come to be known to those of ordinary skill in the art, are expressly incorporated herein by reference and are intended to be encompassed by the present Claims. Any term used in the Specification and/or in the Claims, and expressly given a meaning in the Specification and/or Claims in the present Application, shall have that meaning, regardless of any dictionary or other commonly used meaning for such a term. It is not intended or necessary for a device or method discussed in the Specification as an embodiment, to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

What is claimed is:

1. A device comprising:
   a vessel;
   a near normal incidence EUV reflective optic defining an axis and disposed in said vessel, said optic having a focal point on said axis and near an irradiation region in said vessel;
   a trap disposed in the vessel, said trap having a plurality of spaced apart vanes, each of the vanes having a surface extending in the direction of said axis and radially; and
   a source of a magnetic field disposed in said vessel for deflecting debris in said vessel to protect said optic, said magnetic field being substantially axially symmetric about said axis, said source positioned to interpose the optic between the source and the irradiation region and
   a magnetic field shaping element disposed in said vessel and configured to curve said magnetic field to make said magnetic field proximate said surface of each of the vanes along the surface and approximately normal to the direction of ion paths from said irradiation region.

2. A device as recited in claim 1 wherein said magnetic field source comprises a widening spiral coil substantially conforming to the shape of the reflective optic and a current source passing electrical current through the coil.

3. A device as recited in claim 2 wherein said magnetic field source further comprises a return yoke.

4. A device as recited in claim 1 wherein said near normal incidence EUV reflective optic has a reflective surface shaped as a portion of a prolate spheroid.

5. A device as recited in claim 1 further comprising a flowing buffer gas at a gas number density, n, between the plasma and optic, the gas number density, n, being sufficient to combine with the trap and magnetic field to protect said optic from substantially all plasma emitted ions.

6. A device comprising;
   a vessel;
   a near normal incidence EUV reflective optic, the optic symmetric about an axis, disposed in said vessel and producing a cone of reflected EUV light directed toward an intermediate region; and
   magnetic field source means for deflecting debris in said vessel to protect said optic, said source means comprising a plurality of elongated magnets positioned adjacent to an irradiation site within said vessel and extending substantially normal to the axis, and a magnet positioned adjacent to the reflective optic.

7. A device as recited in claim 6 wherein said plurality of magnets comprises a first magnet having a first magnetization direction and a second magnet having a second magnetization direction, the first and second magnets aligned with the first magnetization direction substantially parallel to the second magnetization direction.

8. A device as recited in claim 7 wherein said first and second magnets are permanent magnets.

9. A device as recited in claim 7 wherein said first magnet is coupled to said second magnet by a yoke.

10. A device as recited in claim 7 wherein said magnet positioned adjacent to the reflective optic has a third magnetization direction and said third magnetization direction is substantially normal to said first magnetization direction.

11. A device as recited in claim 6 wherein said plurality of magnets comprises a first magnet having a first magnetization direction and a second magnet having a second magnetization direction, the first and second magnets aligned with the first magnetization direction substantially anti-parallel to the second magnetization direction.

12. A device as recited in claim 11 wherein said first and second magnets are permanent magnets with said first magnet coupled to said second magnet by a yoke.

13. A device as recited in claim 11 wherein said magnet positioned adjacent to the reflective optic has a third magnetization direction and said third magnetization direction is substantially normal to said first magnetization direction.

14. A device as recited in claim 6 further comprising a flowing buffer gas at a gas number density, n, between the plasma and optic, the gas number density, n, being sufficient to combine with the magnetic field to protect said optic from substantially all plasma emitted ions.

15. A device comprising:
a vessel;
a near normal incidence EUV reflective optic disposed in said vessel, said optic having a focal point substantially coinciding with an irradiation region within said vessel;
a gas flow system in fluid communication with said vessel and configured to introduce a buffer gas into and exhaust said buffer gas from said vessel, said gas flow system also configured to reduce initial energies of ions generated at said focal point by more than three-quarters to produce reduced energy ions by controlling flow of said buffer gas between said optic and said focal point; and
a source of a magnetic field disposed in said vessel for deflecting said reduced energy ions.

16. A device as recited in claim 15 wherein said gas comprises hydrogen at a number density equivalent to a pressure at room temperature greater than 0.1 Torr.

17. A device as recited in claim 15 wherein said gas flows at a gas flow rate greater than 100 sccm.

18. A device as recited in claim 6 wherein the near normal incidence EUV reflective optic has an optic surface and said magnet positioned adjacent to the reflective optic is shaped to conform to the optic's surface.

19. A device as recited in claim 6 wherein said magnet positioned adjacent to the reflective optic extends from an edge of said optic to an opposing edge of said optic.

20. A device as recited in claim 6 wherein said plurality of electromagnets comprises a first magnet having a first magnetization direction and a second magnet having a second magnetization direction, and wherein said plurality of elongated magnets extends substantially normal to said first and second magnetization directions.

21. A process comprising:
producing EUV light within a vessel by creating a plasma at a plasma site within said vessel, the plasma generating ions;
focusing said EUV light using a near normal incidence EUV reflective optic defining an axis and disposed in said vessel;
trapping said ions using a trap disposed in the vessel using a trap having a plurality of spaced apart vanes;
creating a magnetic field in said vessel, said magnetic field being substantially axially symmetric about said axis and being created by a source positioned to interpose the optic between the source and the plasma site; and
curving said magnetic field to make said magnetic field proximate said surface of each of the vanes along the surface approximately normal to the direction of ion paths from said plasma site to deflect debris in said vessel to protect said optic.

22. A device as recited in claim 19 wherein said magnet positioned adjacent to the reflective optic extends from an edge of said optic to an opposing edge of said optic and is further positioned adjacent to a central portion of the optic.

23. A device comprising:
a vessel;
a near normal incidence EUV reflective optic defining an axis and disposed in said vessel, said optic having a focal point on said axis and near an irradiation region in said vessel;
a trap disposed in the vessel, said trap having a plurality of spaced apart vanes, each of the vanes having a surface extending in the direction of said axis and radially; and
a source of a magnetic field disposed in said vessel for deflecting debris in said vessel to protect said optic, said magnetic field being substantially axially symmetric about said axis, said source positioned to interpose the optic between the source and the irradiation region and
means disposed in said vessel for shaping said magnetic field by curving said magnetic field and making said magnetic field proximate said surface of each of the vanes and along the surface approximately normal to the direction of ion paths from said irradiation region.

* * * * *